(12) United States Patent
Mulkens et al.

(10) Patent No.: US 7,589,818 B2
(45) Date of Patent: Sep. 15, 2009

(54) LITHOGRAPHIC APPARATUS, ALIGNMENT APPARATUS, DEVICE MANUFACTURING METHOD, AND A METHOD OF CONVERTING AN APPARATUS

(75) Inventors: Johannes Catharinus Hubertus Mulkens, Maastricht (NL); Marinus Aart Van Den Brink, Moergestel (NL); Erik Roelof Loopstra, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 948 days.

(21) Appl. No.: 10/743,266

(22) Filed: Dec. 23, 2003

(65) Prior Publication Data

US 2005/0132914 A1    Jun. 23, 2005

(51) Int. Cl.
G03B 27/42    (2006.01)
G03B 27/52    (2006.01)

(52) U.S. Cl. .......................... 355/53; 355/55

(58) Field of Classification Search ............... 355/30, 355/53, 67, 55, 77; 359/30, 196, 227, 381, 359/754; 250/201.4, 548
See application file for complete search history.

(56) References Cited

U.S. PATENT DOCUMENTS

| | | | |
|---|---|---|---|
| 3,573,975 A | 4/1971 | Dhaka et al. ............. 117/212 |
| 3,648,587 A | 3/1972 | Stevens ..................... 95/44 |
| 4,346,164 A | 8/1982 | Tabarelli et al. .......... 430/311 |
| 4,390,273 A | 6/1983 | Loebach et al. ........... 355/125 |
| 4,396,705 A | 8/1983 | Akeyama et al. .......... 430/326 |
| 4,480,910 A | 11/1984 | Takanashi et al. .......... 355/30 |
| 4,506,977 A * | 3/1985 | Sato et al. .................. 355/53 |
| 4,509,852 A | 4/1985 | Tabarelli et al. ............ 355/30 |
| 4,616,130 A | 10/1986 | Omata |
| 4,815,098 A * | 3/1989 | Manabe .................... 373/130 |
| 5,040,020 A | 8/1991 | Rauschenbach et al. ..... 355/53 |
| 5,088,324 A * | 2/1992 | Nemeth .................... 73/291 |
| 5,121,256 A | 6/1992 | Corle et al. ............... 359/664 |
| 5,610,683 A | 3/1997 | Takahashi ................. 355/53 |
| 5,636,000 A * | 6/1997 | Ushida et al. ............. 355/30 |
| 5,715,039 A | 2/1998 | Fukuda et al. ............ 355/53 |
| 5,721,079 A * | 2/1998 | Goto ........................ 430/22 |
| 5,825,043 A | 10/1998 | Suwa ...................... 250/548 |

(Continued)

FOREIGN PATENT DOCUMENTS

DE    DD 206 607    2/1984

(Continued)

OTHER PUBLICATIONS

Joeri Lof et al., U.S. Appl. No. 10/705,805, filed Nov. 12, 2003.

(Continued)

*Primary Examiner*—Peter B Kim
(74) *Attorney, Agent, or Firm*—Pillsbury Winthrop Shaw Pittman LLP

(57) ABSTRACT

A detector detects liquid in the path of a projection beam or alignment beam. A controller then determines which one or more of a plurality of compensating optical elements may be provided in the optical path of the projection beam or alignment beam in order to focus the projection beam or alignment beam on the surface of the substrate. The appropriate optical element may be placed in the path of the projection beam or alignment beam directly as a final element of the projection system or alignment system respectively.

84 Claims, 6 Drawing Sheets

U.S. PATENT DOCUMENTS

| | | | |
|---|---|---|---|
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,304,317 B1* | 10/2001 | Taniguchi et al. | 355/55 |
| 6,456,430 B1* | 9/2002 | Kasahara et al. | 359/380 |
| 6,560,032 B2 | 5/2003 | Hatano | 359/656 |
| 6,600,547 B2 | 7/2003 | Watson et al. | |
| 6,603,130 B1 | 8/2003 | Bisschops et al. | 250/492.1 |
| 6,633,365 B2 | 10/2003 | Suenaga | 355/53 |
| 2002/0020821 A1 | 2/2002 | Van Santen et al. | 250/492 |
| 2002/0097488 A1* | 7/2002 | Yamaguchi et al. | 359/380 |
| 2002/0126269 A1* | 9/2002 | Sato | 355/77 |
| 2002/0163629 A1 | 11/2002 | Switkes et al. | 355/53 |
| 2002/0167651 A1* | 11/2002 | Boonman et al. | 355/67 |
| 2003/0123040 A1 | 7/2003 | Almogy | 355/69 |
| 2003/0174408 A1 | 9/2003 | Rostalski et al. | 359/642 |
| 2004/0000627 A1 | 1/2004 | Schuster | |
| 2004/0021844 A1 | 2/2004 | Suenaga | |
| 2004/0075895 A1 | 4/2004 | Lin | 359/380 |
| 2004/0109237 A1 | 6/2004 | Epple et al. | |
| 2004/0119954 A1 | 6/2004 | Kawashima et al. | 355/30 |
| 2004/0125351 A1 | 7/2004 | Krautschik | 355/53 |
| 2005/0068639 A1* | 3/2005 | Pierrat et al. | 359/754 |

FOREIGN PATENT DOCUMENTS

| | | |
|---|---|---|
| DE | DD 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 60-223112 | 11/1985 |
| JP | 60-223122 A | 11/1985 |
| JP | 62-032613 A | 2/1987 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 5-275306 | 10/1993 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 11-201717 A | 7/1999 |
| JP | 2000-058436 | 2/2000 |
| JP | 2000058436 A * | 2/2000 |
| JP | 2001-091849 | 4/2001 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | WO2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

Joeri Lof et al., U.S. Appl. No. 10/705,783, filed Nov. 12, 2003.
Helmar Van Santen et al., U.S. Appl. No. 10/743,271, filed Dec. 23, 2003.
Klaus Simon et al., U.S. Appl. No. 10/724,402, filed Dec. 1, 2003.
Joannes T. Desmit et al., U.S. Appl. No. 10/705,804, filed Nov. 12, 2003.
Antonius T.A.M. Derksen et al., U.S. Appl. No. 10/705,785, Nov. 12, 2003.
Arno J. Bleeker, U.S. Appl. No. 10/715,116, filed Nov. 18, 2003.
Bob Streefkerk et al., U.S. Appl. No. 10/719,683, filed Nov. 24, 2003.
Joeri Lof et al., U.S. Appl. No. 10/705,816, filed Nov. 12, 2003.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths To Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future FAB International, vol. 15, Jul. 11, 2003.
H. Kawata et al., "Fabrication of 0.2μm Fine Patterns Using Optical Projection Lithography with an Oil Immersion Lens", Jpn. J. Appl. Phys. vol. 31 (1992), pp. 4174-4177.
G. Owen et al., "1/8μm, Optical Lithography", J. Vac. Sci. Technol. B., vol. 10, No. 6, Nov./Dec. 1992, pp. 3032-3036.
S. Owa et al., "Update on 193nm immersion exposure tool", Litho Forum, International Sematech, Los Angeles, Jan. 27-29, 2004, Slide Nos. 1-51.
H. Hata, "The Development of Immersion Exposure Tools", Litho Forum, International Sematech, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $k_3$ coefficient in nonparaxial λ/NA scaling equations for resolution, depth of focus, and immersion lithography, *J. Microlith., Microfab., Microsyst.* 1(1):7-12 (2002).
Dierichs, U.S. Appl. No. 10/775,326, filed Feb. 11, 2004.

Duineveld et al., U.S. Appl. No. 10/773,461, filed Feb. 9, 2004.
Flagello et al., U.S. Appl. No. 10/698,012, filed Oct. 31, 2003.
Suwa et al., U.S. Appl. No. 10/367,910, filed Feb. 19, 2003.
Translation of Notice of Reasons for Rejection in Japanese Patent Application No. 2004-371208, dated Dec. 6, 2007.

Notice of Reasons for Rejection issued for Japanese Patent Application No. 2004-371208, dated Aug. 26, 2008.

* cited by examiner

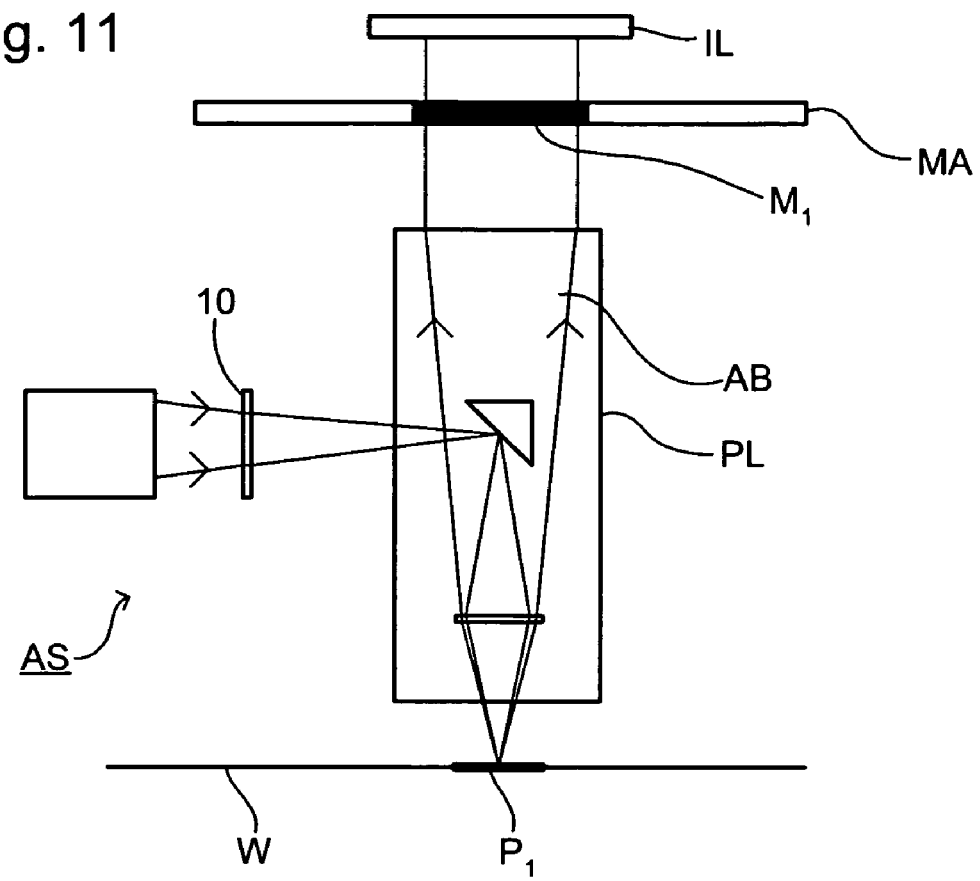

LITHOGRAPHIC APPARATUS, ALIGNMENT APPARATUS, DEVICE MANUFACTURING METHOD, AND A METHOD OF CONVERTING AN APPARATUS

FIELD

The present invention relates to a lithographic apparatus, an alignment apparatus, a device manufacturing method, and a method of converting an apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.)

However, submersing the substrate or substrate and substrate table in a bath of liquid (see for example United States patent U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

In addition to the solution described above, a liquid supply system in a second solution may be provided that comprises a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system is disclosed in U.S. patent applications U.S. Ser. No. 10/705,805 and U.S. Ser. No. 10/705,783, both hereby incorporated in their entirety by reference.

Due to the differing refractive indices of an immersion liquid and a gas (such as air), the optical path lengths of the projection beam in lithographic projection apparatus with immersion liquid and without immersion liquid are different. Different projection systems may therefore need to be designed for both "dry" lithography and immersion lithography. Lens design is expensive and therefore this adds considerably to the cost of production of, for example, integrated circuits.

A similar problem occurs in the alignment of substrates. To align a substrate, an alignment beam is projected towards a reference mark on the substrate or substrate table from where it is partially reflected back towards an alignment mark. If immersion liquid is present between the substrate table and the alignment system projecting the alignment beam, the optical path length of the alignment beam will be changed and the alignment beam will no longer focus accurately on the surface of the reference mark. There could be residual liquid on the alignment mark or sensor on the substrate table if immersion liquid has previously been on the substrate table and a subsequent substrate and is being aligned prior to exposure.

Accordingly, it would be advantageous, for example, to provide a lithographic projection apparatus and an alignment apparatus for use both with and without immersion liquid.

According to an aspect, there is provided a method of converting a projection lens system of a lithographic projection apparatus, the method comprising at least one of exchanging a compensating optical element in the optical path of the projection lens system for another compensating optical element, adding a further compensating optical element in the optical path of the projection lens system, and removing a further compensating optical element in the optical path of the projection lens system, such that with a liquid between the projection lens system and the point of focus of the projection lens system, the distance of the point of focus of the projection lens system from a non parallel optical element will remain the same as without the liquid between the projection lens system and the point of focus of the projection lens system.

According to a further aspect, there is provided a method of converting a projection lens system of a lithographic projection apparatus, the method comprising at least one of exchanging a compensating optical element in the optical path of the projection lens system for another compensating optical element, adding a further compensating optical element in the optical path of the projection lens system, and removing a further compensating optical element in the optical path of the projection lens system, such that without a liquid between the projection lens system and the point of focus of the projection lens system, the distance of the point of focus of the projection lens system from a non parallel optical element will remain the same as with the liquid between the projection lens system and the point of focus of the projection lens system.

According to a further aspect, there is provided a method of converting an alignment lens system of an alignment apparatus, said method comprising at least one of exchanging a compensating optical element in the optical path of the alignment lens system for another compensating optical element, adding a further compensating optical element in the optical path of the alignment lens system, and removing a further compensating optical element in the optical path of the alignment lens system, such that with a liquid between the alignment lens system and the point of focus of the alignment lens system, the distance of the point of focus of the alignment lens system from a non parallel optical element will remain the same as without the liquid between the alignment lens system and the point of focus of the alignment lens system.

According to a further aspect, there is provided a method of converting an alignment lens system of an alignment apparatus, the method comprising at least one of exchanging a compensating optical element in the optical path of the alignment lens system for another compensating optical element, adding a further compensating optical element in the optical path of the alignment lens system, and removing a further compensating optical element in the optical path of the alignment lens system, such that without a liquid between the alignment lens system and the point of focus of the alignment lens system, the distance of the point of focus of the alignment lens system from a non parallel optical element will remain the same as with the liquid between the alignment lens system and the point of focus of the alignment lens system.

According to a further aspect, there is provided a method of converting a projection lens system of a lithographic projection apparatus, the method comprising at least one of exchanging a compensating optical element in the optical path of the projection lens system for another compensating optical element, adding a further compensating optical element in the optical path of the projection lens system, and removing a further compensating optical element in the optical path of the projection lens system such that the at least one of the presence and position of the compensating optical element in the optical path of the projection lens system is adjusted to ensure that the total optical path length between a patterning device and the point of focus of a patterned beam remains unchanged with a liquid between the projection lens system and a substrate from without the liquid between the projection lens system and the substrate.

According to a further aspect, there is provided a method of converting a projection lens system of a lithographic projection apparatus, the method comprising at least one of exchanging a compensating optical element in the optical path of the projection lens system for another compensating optical element, adding a further compensating optical element in the optical path of the projection lens system, and removing a further compensating optical element in the optical path of the projection lens system such that the at least one of the presence and position of the compensating optical element in the optical path of the projection lens system is adjusted to ensure that the total optical path length between a patterning device and the point of focus of a patterned beam remains unchanged without liquid between the projection lens system and a substrate from with the liquid between the projection lens system and the substrate.

According to a further aspect, there is provided a method of converting an alignment lens system of an alignment apparatus, the method comprising at least one of exchanging a compensating optical element in the optical path of the alignment lens system for another compensating optical element, adding a further compensating optical element in the optical path of the alignment lens system, and removing a further compensating optical element in the optical path of the alignment lens system such that the at least one of the presence and position of the compensating optical element in the optical path of the alignment lens system is adjusted to ensure that the total optical path length between a reference mark and the point of focus of an alignment beam remains unchanged with a liquid between the alignment lens system and a substrate from without the liquid between the alignment lens system and the substrate.

According to a further aspect, there is provided a method of converting an alignment lens system of an alignment apparatus, the method comprising at least one of exchanging a compensating optical element in the optical path of the alignment lens system for another compensating optical element, adding a further compensating optical element in the optical path of the alignment lens system, and removing a further compensating optical element in the optical path of the alignment lens system such that the at least one of the presence and position of the compensating optical element in the optical path of the alignment lens system is adjusted to ensure that the total optical path length between a reference mark and the point of focus of an alignment beam remains unchanged without liquid between the alignment lens system and a substrate from with the liquid between the alignment lens system and the substrate.

A compensating optical element is used to compensate for the change of path length due to the presence or absence of immersion liquid so that the apparatus always focuses at substantially the same position in space regardless of the presence or not of immersion liquid. For example, the optical element(s) placed in the projection beam may be chosen and arranged such that the optical path length between a patterning device and the substrate or substrate table remains constant regardless of the quantity of liquid in the path of the projection beam, i.e. the position of focus does not change. Similarly, for example, the optical element(s) placed in the alignment may be chosen and arranged such that the optical path length between a reference mark and a substrate mark remains constant regardless of the quantity of liquid in the path of the projection beam, i.e. the position of focus does not change. The same projection or alignment system can thus be used in apparatus' with and without immersion liquid thereby reducing the cost of lens design and development. The apparatus can be converted between an apparatus used in conjunction with immersion liquid and an apparatus used without immersion liquid.

Changing the arrangement of the compensating optical element in the projection beam or alignment beam may comprise placing a different compensating optical element in the path of the projection beam or alignment beam. The appropriate compensating optical element can be chosen depending on the quantity of liquid in the projection or alignment beam. Alternatively or in addition, an additional optical element could be placed in the path of the projection beam or alignment beam. The compensating optical element can be conveniently arranged to be the final element of the projection system or the alignment system.

In an embodiment, the different compensating optical elements may be placed in the projection beam or alignment beam at different positions in the direction of the propagation of the beam. For example, each optical element could have a mutually exclusive station in the projection beam or alignment beam such that the optical elements do not collide with each other when placed simultaneously in the path of the projection beam or alignment beam. In the case of a single optical element replacing another optical element, the one for use with immersion liquid will typically need to be placed closer to the substrate than the other optical element. Some optical elements would for example be closer to the substrate table and others would be closer to the radiation source. The thickness of a compensating optical element may be, in an embodiment, between 50 μm and 500 μm. In an embodiment, the compensating optical element may be placed at a distance of less than 3 mm from the substrate table. The compensating optical element is therefore close to the image plane so spherical aberrations may be constant over the field.

In an embodiment, the compensating optical element may be a plane plate. To adjust the optical path length of the projection beam or alignment beam, different compensating optical elements can have different thicknesses and/or different optical properties, in particular different refractive indices. For example, a compensating optical element may be hollow and filled with a fluid having a different refractive index. This can be done, for example, by changing the salt concentration of the fluid or by changing the ratio of a mixture of the fluids within the compensating optical element.

The method described above may be carried out by a user. The user may be an operator, the owner of the apparatus, an external contractor employed specifically to convert apparatus or any other person needing to convert such apparatus. The method may be non-automatic.

According to a further aspect, there is provided a lithographic apparatus comprising:

an illumination system configured to provide a beam of radiation;

a support structure configured to hold a patterning device, the patterning device configured to impart the beam with a pattern in its cross-section;

a substrate table configured to hold a substrate;

a projection lens system configured to project the beam as patterned onto a target portion of the substrate; and a plurality of optical elements removably positionable in the path of the beam to adjust the focal plane of the beam, wherein the at least one of the presence and position of one or more of the plurality of optical elements in the path of the beam can be adjusted to ensure that the total optical path length of the beam remains unchanged irrespective of the presence or absence of liquid between the projection lens system and the substrate table.

According to a further aspect, there is provided a lithographic apparatus comprising:

an illumination system configured to provide a beam of radiation;

a support structure configured to hold a patterning device, the patterning device configured to impart the beam with a pattern in its cross-section;

a substrate table configured to hold a substrate;

a projection lens system configured to project the beam as patterned onto a target portion of the substrate; and a plurality of optical elements removably positionable in the path of the beam to adjust the focal plane of the beam, wherein the at least one of the presence and position of one or more of the plurality of optical elements in the path of the beam is adjusted such that with a liquid between the projection lens system and the point of focus of the projection lens system, the point of focus of the projection lens system remains unchanged from without a liquid between the projection lens system and the point of focus of the projection lens system.

According to a further aspect, there is provided an alignment apparatus comprising:

a substrate table configured to hold a substrate, the substrate having a substrate mark;

an alignment lens system configured to detect alignment between a reference mark and the substrate mark using an alignment beam of radiation; and a plurality of optical elements removably positionable in the path of the alignment beam configured to adjust the focal plane of the alignment lens system when detecting alignment, wherein the at least one of the presence and position of one or more of the plurality of optical elements in the path of the alignment beam can be adjusted to ensure that the total optical path length of the alignment beam remains unchanged irrespective of the quantity of liquid between the alignment lens system and the substrate table.

According to a further aspect, there is provided an alignment apparatus comprising:

a substrate table configured to hold a substrate, the substrate having a substrate mark;

an alignment lens system configured to detect alignment between a reference mark and the substrate mark using an alignment beam of radiation; and a plurality of optical elements removably positionable in the path of the alignment beam configured to adjust the focal plane of the alignment lens system when detecting alignment, wherein the at least one of the presence and position of one or more of the plurality of optical elements in the path of the alignment beam is adjusted such that with a liquid between the alignment lens system and the point of focus of the alignment lens system, the point of focus of the alignment lens system remains unchanged from without a liquid between the alignment lens system and the point of focus of the alignment lens system.

In an embodiment, there is provided a controller configured to control which one or more of the plurality of optical elements is placed in the projection beam or the alignment beam dependent on the quantity of liquid between the projection system or the alignment system and the substrate table. The controller could take the form of a computer system or a program loaded on a computer system. There may also be provided a liquid supply system configured to at least partly fill a space between the projection system or the alignment lens system and the substrate table, with a liquid.

According to a further aspect, there is provided a lithographic apparatus comprising:

an illumination system configured to provide a beam of radiation;

a support structure configured to hold a patterning device, the patterning device configured to impart the beam with a pattern in its cross-section;

a substrate table configured to hold a substrate;

a projection lens system configured to project the beam as patterned onto a target portion of the substrate;

a plurality of optical elements removably positionable in the path of the beam to adjust the focal plane of the beam; and a plurality of docking stations in the path of the beam configured to hold the plurality of optical elements.

According to a further aspect, there is provided an alignment apparatus comprising:

a substrate table configured to hold a substrate, the substrate having a substrate mark;

an alignment lens system configured to detect alignment between a reference mark and the substrate mark using an alignment beam of radiation;

a plurality of optical elements removably positionable in the path of the alignment beam configured to adjust the focal plane of the alignment lens system when detecting alignment; and a plurality of docking stations in the path of the alignment beam configured to hold the plurality of optical elements.

Each docking station may be a predetermined distance from a final non-parallel plate element of the projection system or the alignment system. At least one docking station may be arranged such that the focal point of the projection beam or alignment beam is on the substrate or substrate table when no liquid is present in the path of the projection beam or alignment beam. At least one docking station may be arranged such that the focal point of the projection beam or alignment beam is on the substrate or substrate table when a liquid is present in the path of the projection beam or alignment beam.

According to a further aspect, there is provided an alignment apparatus comprising:

a substrate table configured to hold a substrate, the substrate having a substrate mark;

an alignment lens system configured to detect alignment between a reference mark and the substrate mark using an alignment beam of radiation;

a plurality of optical elements removably positionable in the path of the alignment beam configured to adjust the focal plane of the alignment lens system when detecting alignment;

a detector configured to detect the presence of liquid between the alignment lens system and the substrate table; and a controller configured to control which one or more of the plurality of optical elements is placed in the path of the alignment beam on the basis of results from the detector.

According to a further aspect, there is provided a lithographic projection apparatus comprising an illumination system configured to provide a beam of radiation, a support structure configured to hold a patterning device that serves to pattern the beam according to a desired pattern, a projection system configured to project the patterned beam onto a target portion of the substrate, and an alignment apparatus according to the above.

The alignment beam may traverse at least part of the projection system.

According to a further aspect, there is provided a device manufacturing method comprising:

projecting a beam as patterned by a patterning device onto a target portion of a substrate; and adjusting the focal plane of the beam by interposing one or more of a plurality of optical elements in the path of the beam, to ensure that the focal point of the beam focuses on the same point regardless of the presence or absence of liquid in the beam.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm), in particular optical radiation.

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of a patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion liquid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 11 shows an alternative arrangement of the optical element in an alignment apparatus according to an embodiment of the invention.

DETAILED DESCRIPTION

Figure 1:
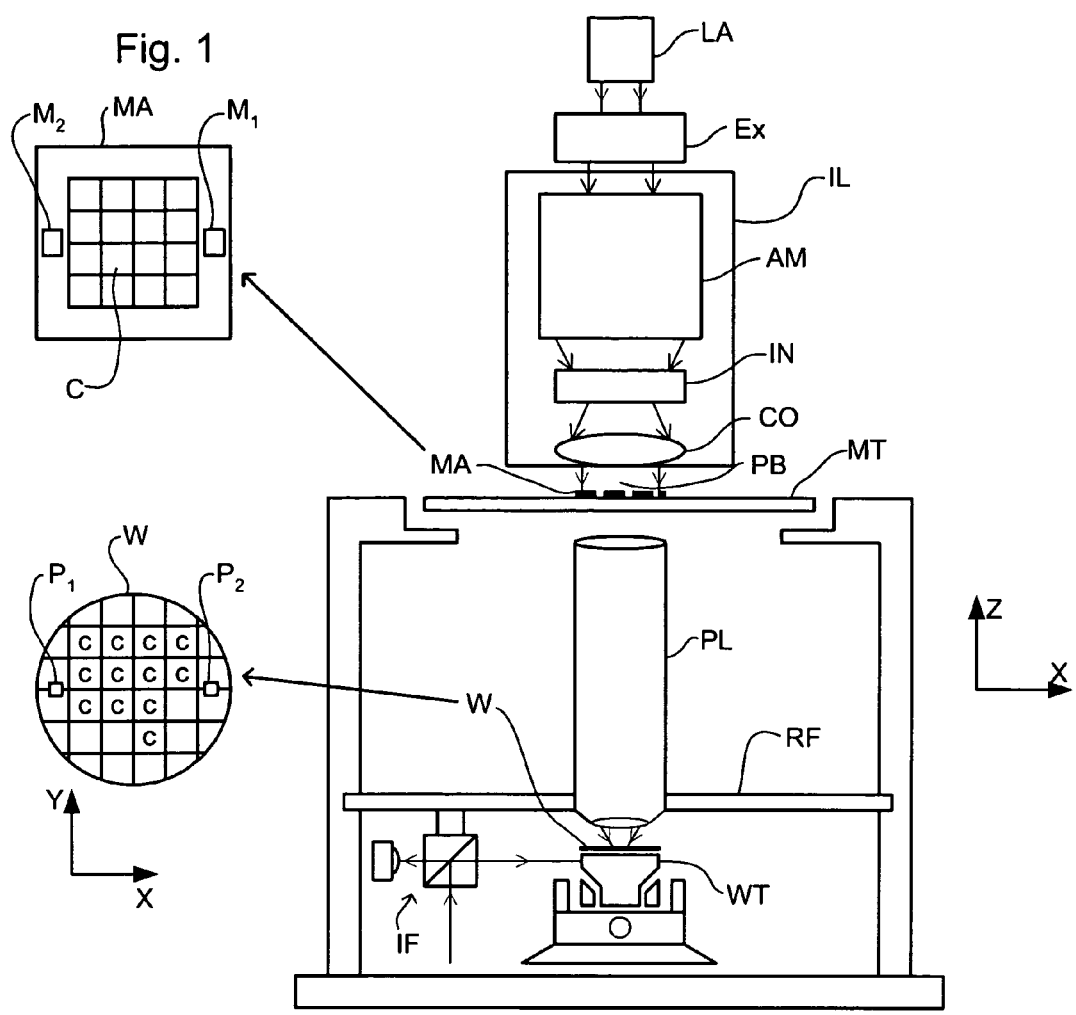
FIG. 1 depicts a lithographic apparatus according to an embodiment of the invention.
Figure 2:
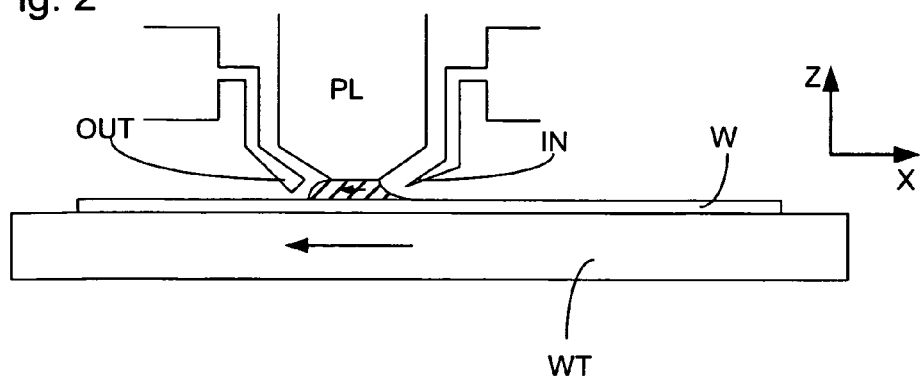
FIG. 2 depicts a liquid supply system.
Figure 3:
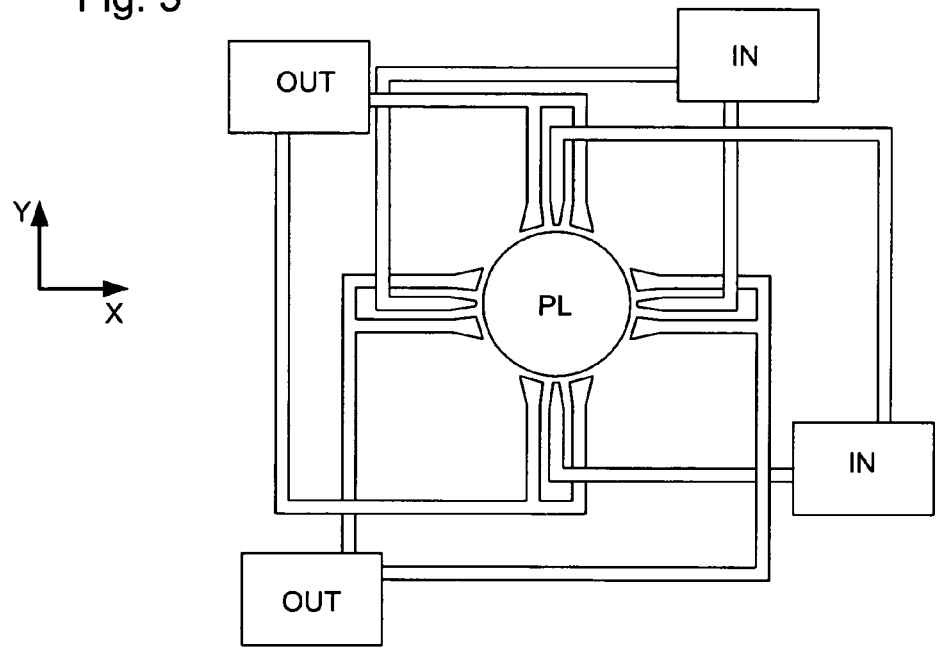
FIG. 3 is an alternative view of the liquid supply system shown in FIG. 2.

FIG. 1 schematically depicts a lithographic apparatus according to a particular embodiment of the invention. The apparatus comprises:
- an illumination system (illuminator) IL for providing a projection beam PB of radiation (e.g. UV radiation).
- a first support structure (e.g. a mask table) MT for supporting a patterning device (e.g. a mask) MA and connected to a first positioning device PM for accurately positioning the patterning device with respect to item PL;
- a substrate table (e.g. a wafer table) WT for holding a substrate (e.g. a resist-coated wafer) W and connected to a second positioning device PW for accurately positioning the substrate with respect to item PL; and
- a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks $M_1$, $M_2$ and substrate alignment marks $P_1$, $P_2$.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 4:
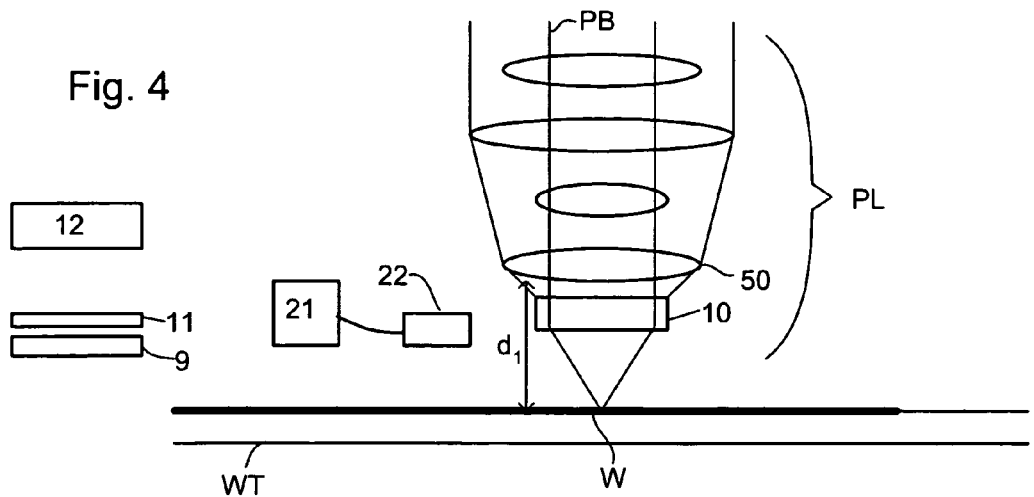
FIG. 4 shows a lithographic projection apparatus according to an embodiment of the invention with an optical element arranged in the projection beam.

As shown in FIG. 4, a detector 22 detects the presence or absence of immersion liquid present on the substrate W. In this example, the detector 22 detects the presence of liquid on the substrate W by the reflection of low intensity electromagnetic waves. However, the presence of liquid could also be detected using, for example, sonar pulses, electric currents or the physical detection of the liquid. In an embodiment, the detector 22 detects the presence of liquid on the target portion C of the substrate, as shown in FIG. 4. Additionally or alternatively, the detector 22 can determine the quantity of immersion liquid present. Based on the measurement by detector 22, the controller 21 determines which one or more of optical elements 9, 10, 11, 12 is/are necessary. The controller 21 can determine which one or more of optical elements 9, 10, 11 and 12 can ensure that the projection beam PB is accurately focused on the upper substrate surface. The selected optical element (e.g., optical element 10) is then moved into the path of the projection beam directly after the final lens element 50 of the projection system PL. The projection beam PB is therefore, to a first order, brought into focus on the upper surface of the substrate and distance $d_1$ between the final non-parallel element of the projection system and the point of focus of the projection beam remains constant. As shown in FIG. 4, the optical element 10 is a plane parallel plate arranged perpendicularly to the direction of propagation of the projection beam PB.

Figure 5:
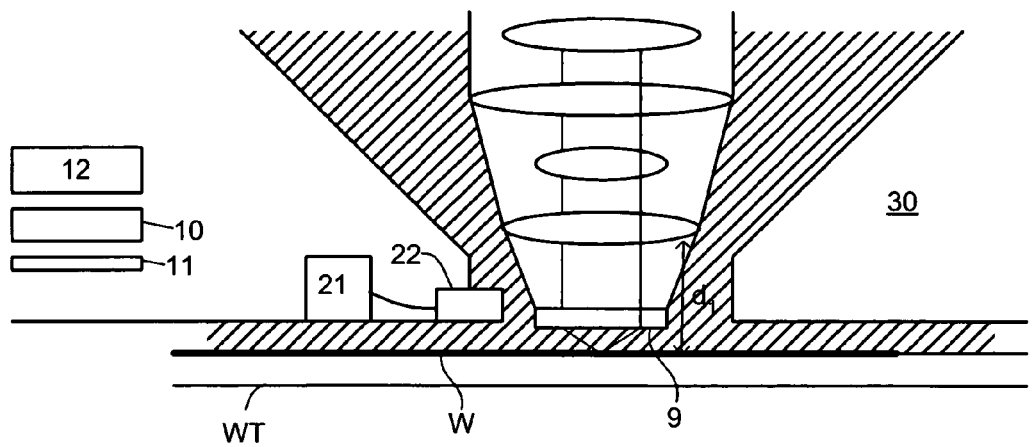
FIG. 5 is the lithographic projection apparatus shown in FIG. 4 with a different optical element arranged in the projection beam.

In FIG. 5, the same lithographic apparatus is used in conjunction with liquid supply system 30. Liquid supply system 30 supplies liquid with a higher refractive index than the surrounding gaseous environment to the path of the projection beam. Due to the difference in refractive indices the optical path length changes. The detector 22 detects liquid between the projection system and the substrate and the controller determines that a different optical element 9 is necessary in the path of the projection beam PB to focus projection beam PB on substrate W. The optical path length between the radiation source and the surface of the substrate and $d_1$ therefore remains constant despite the presence of a liquid with a higher refractive index in the path of the projection beam PB. Optical element 9 is placed in the projection beam PB at a different (lower) position from the original position of optical element 10.

The length of the optical path of the projection beam PB can be varied by adjusting the thickness $d_p$ of the optical element. To adjust the optical path by an amount $d_o$ (to compensate for the presence or absence of liquid) using a material of refractive index $n_o$ the plane plate should have a thickness $d_p$, given by $d_p = c \cdot d_o$ where $$c = \frac{n_1}{n_1 - n_0}$$

where $n_1$ is the refractive index of the plane plate optical element.

Figure 6:
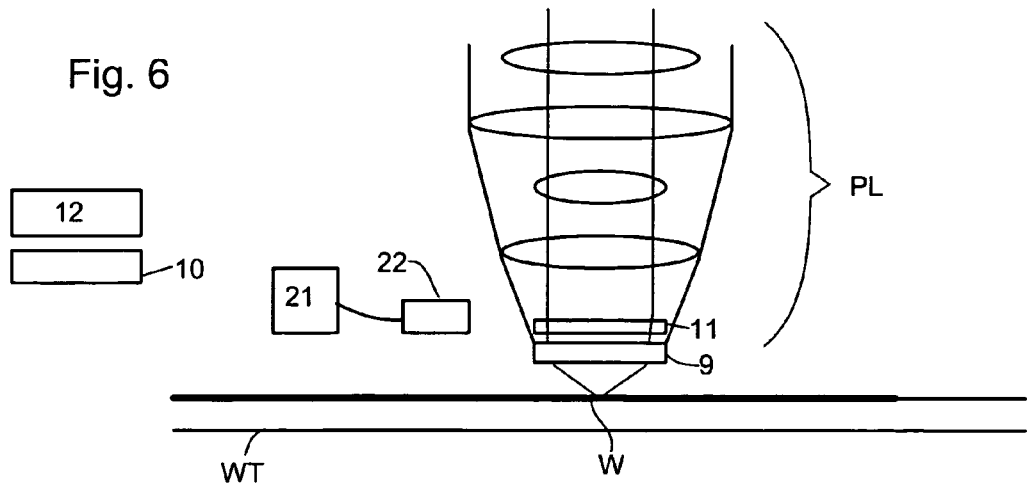
FIG. 6 depicts a lithographic projection apparatus according to an embodiment of the invention with a combination of optical elements in the projection beam.

In FIG. 6, the detector detects no liquid between the projection system and the substrate and the optical element 11 is added to the projection system. Optical elements 9 and 11 have a combined thickness and refraction indices sufficient to focus the projection beam on the surface of the substrate. The optical element 11 can be placed in the projection beam either above or below optical element 9. In this example, each optical element 9, 10, 11, 12 has a (mutually exclusive) position assigned in the projection beam so that any combination of optical elements 9, 10, 11, 12 can be placed in the projection beam without colliding with another optical element.

Figure 7:
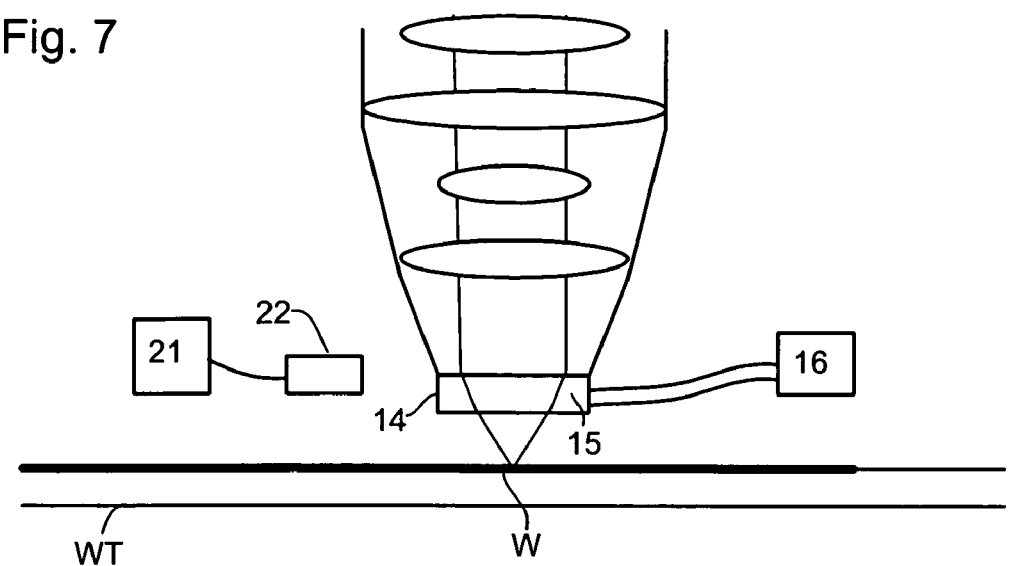
FIG. 7 depicts an arrangement of a liquid filled optical element in a lithographic projection apparatus according to an embodiment of the invention.

Alternatively, the thickness $d_p$ of the optical element 10, 11 is fixed but the refractive index is varied. This could be achieved by replacing a plane plate made of for example glass, by a plane plate made of, for example, perspex. Alternatively, the optical element could be a hollow plane plate filled with a fluid of known refractive index. The refractive index of the optical element 10 is then varied by changing the composition of the fluid. As shown in FIG. 7, the fluid 15 inside the optical element 14 can be replaced and the composition adjusted by the fluid replacement device 16. The composition can be adjusted by, for example, changing the salt concentration in the fluid or changing the ratio of two or more fluids in mixture. The replacement and refreshment of the fluid 15 in the optical element 14 also keeps the optical element 14 cool, thus reducing errors and damage caused by thermal expansion and contraction of components.

Figure 8:
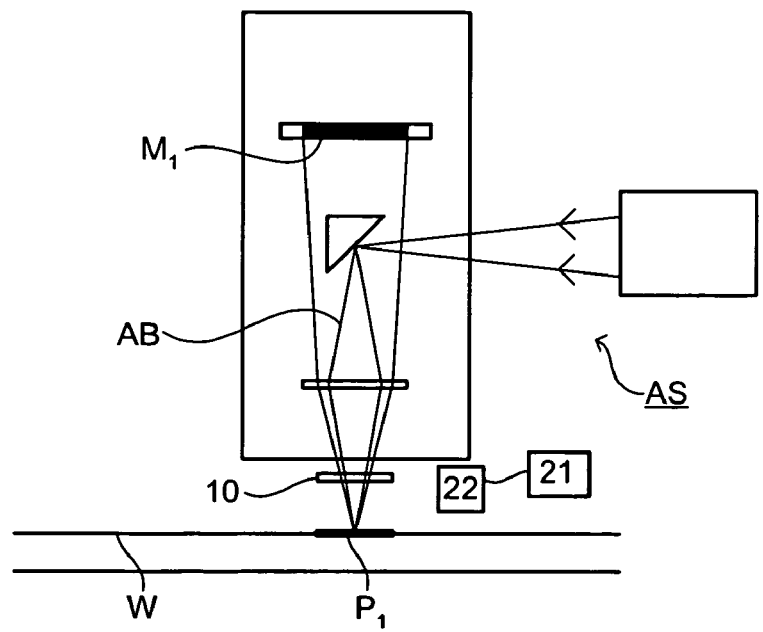
FIG. 8 shows an alignment apparatus according to an embodiment of the invention.

FIG. 8 illustrates an alignment apparatus in which an alignment beam AB is projected towards a substrate mark $P_1$ where it is partially reflected through the alignment system AS. The alignment beam is then imaged onto alignment mark $M_1$. The alignment of substrate mark $P_1$ and alignment mark $M_1$ are detected in a known manner to determine the alignment of substrate W. As shown in FIG. 8, a detector 22 detects the presence and/or quantity of liquid on the substrate and the controller 21 then selects an optical element 10 accordingly.

Figure 9:
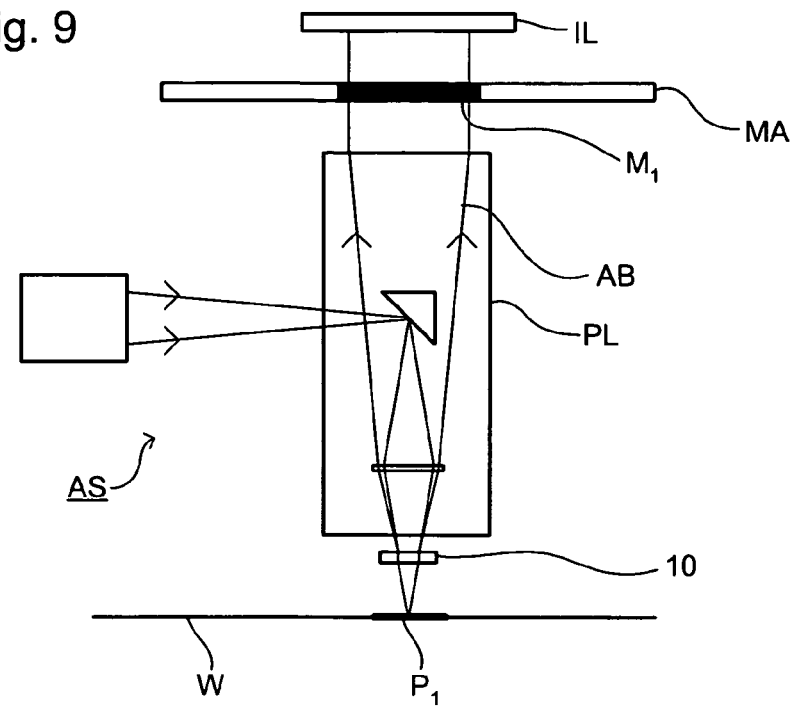
FIG. 9 is an alternative alignment apparatus according to an embodiment of the invention.

Alignment can also take place in a so-called through the lens systems shown in FIG. 9. In such systems the alignment beam AB is projected through the projection lens PL towards the substrate mark $P_1$ and reflected back towards the mark $M_1$ on the mask MA. Again, a detector (not shown in FIG. 9 but shown, for example, as detector 22 in FIG. 8) detects the presence and/or quantity of liquid between the final element of the projection system and the substrate and a controller (not shown in FIG. 9 but shown, for example, as controller 21 in FIG. 8) selects an appropriate optical element to place in the alignment beams to ensure the alignment beam is accurately focused on the substrate mark $P_1$.

Figure 10:
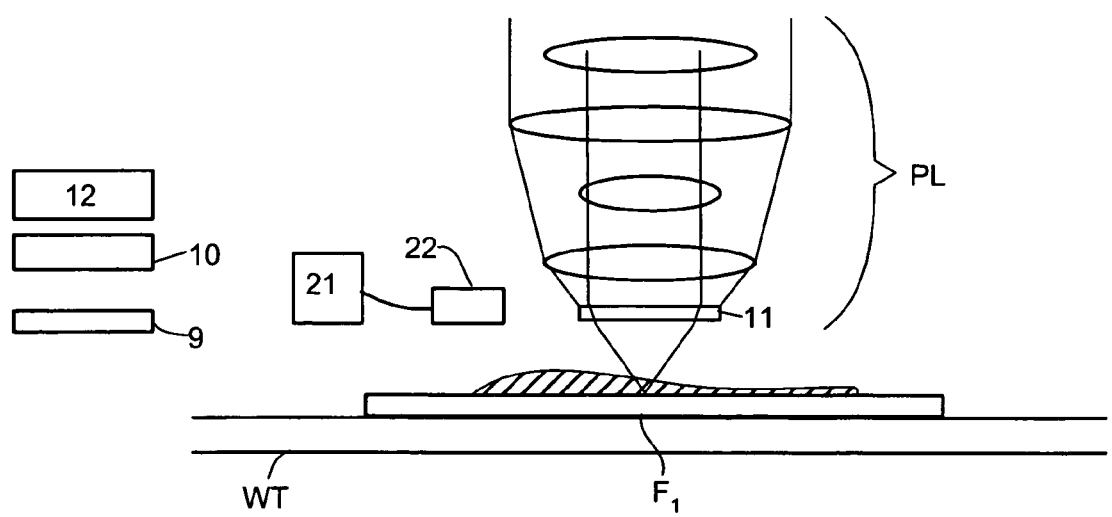
FIG. 10 depicts a projection system in an alignment mode according to an embodiment of the invention.

In FIG. 10, the projection system is being used to project an alignment beam AB towards a reference mark $F_1$ on the substrate table WT. The reference mark $F_1$ is a partially reflective phase grating. Although the clarity of the partially reflected alignment beam AB is reduced by the non-uniformity of the liquid thickness it is still sufficiently clear to enable alignment to take place. If the detector 22 has detected a small amount of liquid present on the substrate W, a thin optical element 11 is selected by the controller 21 and placed in the path of the alignment beam AB. If the detector detects even less liquid, a thicker optical element 10 could be chosen; if more liquid is detected, an even thinner optical element 9 can be chosen.

Although in the examples above the optical elements are placed in the alignment beam or projection beam directly after the projection system PL or alignment system AS to ensure spherical aberrations are constant over the field, they could also be placed at a different position in the system as shown, for example, in FIG. 11. The optical element 10 is placed in the alignment beam AB prior to projection through the projection system PL. The optical element 10 still ensures that the alignment beam AB is accurately focused on the substrate mark $P_1$. To focus the projection beam PB or alignment beam AB onto the surface of the substrate or substrate mark to second or higher orders, the positions of optical elements in the projection system PL or alignment system AS can be adjusted when a different optical element is inserted in the path of the projection beam or alignment beam.

Instead of detector 22 and controller 21 determining if, and which, optical element should be placed in the path of the projection beam PB or alignment beam AB, an operator could decide to change the apparatus from an immersion style apparatus to a "dry" apparatus. The optical element 9, 10, 11, 12 could be screwed to or otherwise permanently attached to the bottom of the projection system PL or alignment system AS at an appropriate distance. When the operator decides to change the apparatus from a "dry" apparatus to an immersion apparatus, the optical element 9, 10, 11, 12 is removed and liquid supply system 30 supplies liquid to the space between the projection system PB or alignment system AS and substrate W. The operator may also adjust the positioning and perhaps shape of some of the other optical elements of the projection system to take account of higher order optical effects.

While specific embodiments of the invention have been described above, it will be appreciated that the invention may be practiced otherwise than as described. The description is not intended to limit the invention.

The invention claimed is:

1. A method of converting a projection lens system of a lithographic projection apparatus, the method comprising (i) exchanging a compensating optical element in the optical path of the projection lens system for another compensating optical element, or (ii) adding a further compensating optical element in the optical path of the projection lens system, or (iii) removing a further compensating optical element in the optical path of the projection lens system, or any combination selected from (i)-(iii), wherein the compensating optical element is exchanged from, added to, or removed from a position prior to a final element in the projection lens system along the optical path, such that with a liquid between the projection lens system and the point of focus of the projection lens system, the distance of the point of focus of the projection lens system from a non parallel optical element will remain the same as without the liquid between the projection lens system and the point of focus of the projection lens system.

2. A method according to claim 1, further comprising such a compensating optical element as a final element of the projection lens system.

3. A method according to claim 1, wherein different compensating optical elements placed in the projection lens system are placed in the optical path at different positions along the optical path.

4. A method according to claim 1, wherein the compensating optical element, when the liquid is between the projection lens system and the point of focus of the projection lens system, is placed at a distance of less than 4 mm from the point of focus of the projection lens system.

5. A method according to claim 1, wherein the thickness of the compensating optical element is between 50 μm and 500 μm.

6. A method according to claim 1, wherein the compensating optical element is a plane parallel plate.

7. A method according to claim 1, wherein different compensating optical elements have different thicknesses.

8. A method according to claim 1, wherein different compensating optical elements have different optical properties.

9. A method according to claim 8, wherein at least one of the different optical properties is different refractive indices.

10. A method according to claim 9, wherein at least one compensating optical element is hollow and filled with a fluid having a different refractive index.

11. A method according to claim 1, wherein the method is carried out by a user.

12. A method according to claim 1, wherein the method is non-automatic.

13. A method of converting a projection lens system of a lithographic projection apparatus, the method comprising (i) exchanging a compensating optical element in the optical path of the projection lens system for another compensating optical element, or (ii) adding a further compensating optical element in the optical path of the projection lens system, or (iii) removing a further compensating optical element in the optical path of the projection lens system, or any combination selected from (i)-(iii), wherein the compensating optical element is a plane parallel plate to be in contact with a liquid, such that without the liquid between the projection lens system and the point of focus of the projection lens system, the distance of the point of focus of the projection lens system from a non parallel optical element will remain the same as with the liquid between the projection lens system and the point of focus of the projection lens system.

14. A method according to claim 13, wherein the compensating optical element is arranged to be a final element of the projection lens system.

15. A method according to claim 13, wherein different compensating optical elements placed in the projection lens system are placed in the optical path at different positions along the optical path.

16. A method according to claim 13, wherein the compensating optical element, when the liquid is between the projection lens system and the point of focus of the projection lens system, is placed at a distance of less than 4 mm from the point of focus of the projection lens system.

17. A method according to claim 13, wherein the thickness of the compensating optical element is between 50 μm and 500 μm.

18. A method according to claim 13, wherein different compensating optical elements have different thicknesses.

19. A method according to claim 13, wherein different compensating optical elements have different optical properties.

20. A method according to claim 19, wherein at least one of the different optical properties is different refractive indices.

21. A method according to claim 20, wherein at least one compensating optical element is hollow and filled with a fluid having a different refractive index.

22. A method according to claim 13, wherein the method is carried out by a user.

23. A method according to claim 13, wherein the method is non-automatic.

24. A method of converting a projection lens system of a lithographic projection apparatus, the method comprising (i) exchanging a compensating optical element in the optical path of the projection lens system for another compensating optical element, or (ii) adding a further compensating optical element in the optical path of the projection lens system, or (iii) removing a further compensating optical element in the optical path of the projection lens system, or any combination selected from (i)-(iii), wherein the compensating optical element is a plane parallel plate, such that the at least one of the presence and position of the compensating optical element in the optical path of the projection lens system is adjusted to ensure that the total optical path length between a patterning device and the point of focus of a patterned beam remains unchanged with a liquid between the projection lens system and a substrate from without the liquid between the projection lens system and the substrate.

25. A method according to claim 24, further comprising detecting with a sensor the presence or absence of liquid between the projection lens system and the substrate and controlling the exchanging, adding, and/or removing based on the detecting.

26. A method according to claim 24, further comprising controlling the exchanging, adding, and/or removing based on a quantity of liquid between the projection lens system and the substrate detected by a sensor.

27. A method according to claim 24, wherein different compensating optical elements placed in the projection lens system are placed in the optical path at different positions along the optical path.

28. A method according to claim 24, wherein the compensating optical element is arranged to be a final element of the projection lens system.

29. A method of converting a projection lens system of a lithographic projection apparatus, the method comprising (i) exchanging a compensating optical element in the optical path of the projection lens system for another compensating optical element, or (ii) adding a further compensating optical element in the optical path of the projection lens system, or (iii) removing a further compensating optical element in the optical path of the projection lens system, or any combination selected from (i)-(iii), wherein the compensating optical element is exchanged from, added to, or removed from a position prior to a final element in the projection lens system along the optical path, such that the at least one of the presence and position of the compensating optical element in the optical path of the projection lens system is adjusted to ensure that the total optical path length between a patterning device and the point of focus of a patterned beam remains unchanged without liquid between the projection lens system and a substrate from with the liquid between the projection lens system and the substrate.

30. A method according to claim 29, further comprising detecting with a sensor the presence or absence of liquid between the projection lens system and the substrate and controlling the exchanging, adding, and/or removing based on the detecting.

31. A method according to claim 29, further comprising controlling the exchanging, adding, and/or removing based on a quantity of liquid between the projection lens system and the substrate detected by a sensor.

32. A method according to claim 29, wherein different compensating optical elements placed in the projection lens system are placed in the optical path at different positions along the optical path.

33. A method according to claim 29, wherein the compensating optical element is a plane parallel plate.

34. A lithographic apparatus comprising:
a support structure configured to hold a patterning device, the patterning device configured to impart a beam of radiation with a pattern in its cross-section;
a substrate table configured to hold a substrate;
a projection lens system configured to project the beam as patterned onto a target portion of the substrate; and
a plurality of optical elements removably positionable in the path of the beam to adjust the focal plane of the beam, wherein each of the optical elements is exchanged from, added to, or removed from a position prior to a final element in the projection lens system along the path,
wherein the presence, or position, or both the presence and position, of one or more of the plurality of optical elements in the path of the beam can be adjusted to ensure that the total optical path length of the beam remains unchanged irrespective of the presence or absence of liquid between the projection lens system and the substrate table.

35. An apparatus according to claim 34, further comprising a controller configured to control which one or more of the plurality of optical elements is placed in the path of the beam dependent on the quantity of liquid between the projection lens system and the substrate table.

36. An apparatus according to claim 34, further comprising a liquid supply system configured to at least partly fill a space between the projection lens system and the substrate table, with a liquid.

37. A lithographic apparatus comprising:
a support structure configured to hold a patterning device, the patterning device configured to impart a beam of radiation with a pattern in its cross-section;
a substrate table configured to hold a substrate;
a projection lens system configured to project the beam as patterned onto a target portion of the substrate;
a plurality of optical elements removably positionable in the path of the beam to adjust the focal plane of the beam, wherein each of the plurality of optical elements is exchanged from, added to, or removed from a position prior to a final element in the projection lens system along the path;
a detector configured to detect the presence of a liquid between the projection lens system and the substrate table; and
a controller configured to control which one or more of the plurality of optical elements is placed in the path of the beam on the basis of results from the detector,
wherein the presence, or position, or both the presence and position, of one or more of the plurality of optical elements in the path of the beam is adjusted such that with the liquid between the projection lens system and the point of focus of the projection lens system, the point of focus of the projection lens system remains unchanged from without a liquid between the projection lens system and the point of focus of the projection lens system.

38. An apparatus according to claim 37, further comprising a controller configured to control which one or more of the plurality of optical elements is placed in the path of the beam dependent on the quantity of liquid between the projection lens system and the substrate table.

39. An apparatus according to claim 37, further comprising a liquid supply system configured to at least partly fill a space between the projection lens system and the substrate table, with a liquid.

40. A device manufacturing method comprising:
projecting a beam as patterned by a patterning device onto a target portion of a substrate;
detecting the presence of a liquid between a projection lens system and the substrate using a detector;
controlling which one or more of a plurality of optical elements is placed in a path of the beam based on the detecting, wherein the one or more of the plurality of optical elements is a plane parallel plate; and
adjusting the focal plane of the beam by interposing the one or more of the plurality of optical elements in the path of the beam, to ensure that the focal point of the beam focuses on the same point regardless of the presence or absence of liquid in the beam.

41. A method according to claim 40, further comprising controlling which one or more of the plurality of optical elements is interposed in the path of the beam dependent on a quantity of liquid between a projection lens system and the substrate table.

42. A method according to claim 40, further comprising at least partly filling a space between a projection lens system and a substrate table, with a liquid.

43. A method of converting an alignment lens system of an alignment apparatus, said method comprising (i) exchanging a compensating optical element in the optical path of the alignment lens system for another compensating optical element, or (ii) adding a further compensating optical element in the optical path of the alignment lens system, or (iii) removing a further compensating optical element in the optical path of the alignment lens system, or any combination selected from (i)-(iii), wherein the compensating optical element is a plane parallel plate to be in contact with a liquid, such that with the liquid between the alignment lens system and the point of focus of the alignment lens system, the distance of the point of focus of the alignment lens system from a non parallel optical element will remain the same as without the liquid between the alignment lens system and the point of focus of the alignment lens system.

44. A method according to claim 43, wherein the alignment lens system is a projection alignment lens system and the compensating optical element is arranged to form a final element of the projection alignment lens system.

45. A method according to claim 43, wherein different compensating optical elements placed in the alignment lens system are placed in the optical path at different positions along the optical path.

46. A method according to claim 43, wherein the compensating optical element, when the liquid is between the alignment lens system and the point of focus of the alignment lens system, is placed at a distance of less than 4 mm from the point of focus of the alignment lens system.

47. A method according to claim 43, wherein the thickness of the compensating optical element is between 50 μm and 500 μm.

48. A method according to claim 43, wherein different compensating optical elements have different thicknesses.

49. A method according to claim 43, wherein different compensating optical elements have different optical properties.

50. A method according to claim 49, wherein at least one of the different optical properties is different refractive indices.

51. A method according to claim 50, wherein at least one compensating optical element is hollow and filled with a fluid having a different refractive index.

52. A method according to claim 43, wherein the method is carried out by a user.

53. A method according to claim 43, wherein the method is non-automatic.

54. A method of converting an alignment lens system of an alignment apparatus, the method comprising (i) exchanging a compensating optical element in the optical path of the alignment lens system for another compensating optical element, or (ii) adding a further compensating optical element in the optical path of the alignment lens system, or (iii) removing a further compensating optical element in the optical path of the alignment lens system, or any combination selected from (i)-(iii), wherein the compensating optical element is exchanged from, added to, or removed from a position prior to a final element in the alignment lens system along the optical path, such that without a liquid between the alignment lens system and the point of focus of the alignment lens system, the distance of the point of focus of the alignment lens system from a non parallel optical element will remain the same as with the liquid between the alignment lens system and the point of focus of the alignment lens system.

55. A method according to claim 54, wherein the alignment lens system is a projection alignment lens system and further comprising such a compensating optical element as a final element of the projection alignment lens system.

56. A method according to claim 54, wherein different compensating optical elements placed in the alignment lens system are placed in the optical path at different positions along the optical path.

57. A method according to claim 54, wherein the compensating optical element, when the liquid is between the alignment lens system and the point of focus of the alignment lens system, is placed at a distance of less than 4 mm from the point of focus of the alignment lens system.

58. A method according to claim 54, wherein the thickness of the compensating optical element is between 50 μm and 500 μm.

59. A method according to claim 54, wherein the compensating optical element is a plane parallel plate.

60. A method according to claim 54, wherein different compensating optical elements have different thicknesses.

61. A method according to claim 54, wherein different compensating optical elements have different optical properties.

62. A method according to claim 61, wherein at least one of the different optical properties is different refractive indices.

63. A method according to claim 62, wherein at least one compensating optical element is hollow and filled with a fluid having a different refractive index.

64. A method according to claim 54, wherein the method is carried out by a user.

65. A method according to claim 54, wherein the method is non-automatic.

66. A method of converting an alignment lens system of an alignment apparatus, the method comprising (i) exchanging a compensating optical element in the optical path of the alignment lens system for another compensating optical element, or (ii) adding a further compensating optical element in the optical path of the alignment lens system, or (iii) removing a further compensating optical element in the optical path of the alignment lens system, or any combination selected from (i)-(iii), wherein the compensating optical element is a plane parallel plate, such that the presence, or position, or both the presence and position, of the compensating optical element in the optical path of the alignment lens system is adjusted to ensure that the total optical path length between a reference mark and the point of focus of an alignment beam remains unchanged with a liquid between the alignment lens system and a substrate from without the liquid between the alignment lens system and the substrate table.

67. A method according to claim 66, further comprising detecting with a sensor the presence or absence of liquid between the alignment lens system and the substrate and controlling the exchanging, adding, and/or removing based on the detecting.

68. A method according to claim 66, further comprising controlling the exchanging, adding, and/or removing based on a quantity of liquid between the alignment lens system and the substrate detected by a sensor.

69. A method according to claim 66, wherein different compensating optical elements placed in the alignment lens system are placed in the optical path at different positions along the optical path.

70. A method according to claim 66, wherein the compensating optical element is arranged to be a final element of the alignment lens system.

71. A method of converting an alignment lens system of an alignment apparatus, the method comprising (i) exchanging a compensating optical element in the optical path of the alignment lens system for another compensating optical element, or (ii) adding a further compensating optical element in the optical path of the alignment lens system, or (iii) removing a further compensating optical element in the optical path of the alignment lens system, or any combination selected from (i)-(iii), wherein the compensating optical elements is exchanged from, added to, or removed from a position prior to a final element in the projection lens system along the optical path, such that the presence, or position, or both the presence and position, of the compensating optical element in the optical path of the alignment lens system is adjusted to ensure that the total optical path length between a reference mark and the point of focus of an alignment beam remains unchanged without liquid between the alignment lens system and a substrate from with the liquid between the alignment lens system and the substrate table.

72. A method according to claim 71, further comprising detecting with a sensor the presence or absence of liquid between the alignment lens system and the substrate and controlling the exchanging, adding, and/or removing based on the detecting.

73. A method according to claim 71, further comprising controlling the exchanging, adding, and/or removing based on a quantity of liquid between the alignment lens system and the substrate detected by a sensor.

74. A method according to claim 71, wherein different compensating optical elements placed in the alignment lens system are placed in the optical path at different positions along the optical path.

75. An alignment apparatus comprising:
a substrate table configured to hold a substrate, the substrate having a substrate mark;
an alignment lens system configured to detect alignment between a reference mark and the substrate mark using an alignment beam of radiation; and
a plurality of optical elements removably positionable in the path of the alignment beam configured to adjust the focal plane of the alignment lens system when detecting alignment, wherein each of the optical elements is exchanged from, added to, or removed from a position prior to a final element in the alignment lens system along the path,
wherein the presence, or position, or both the presence and position, of one or more of the plurality of optical elements in the path of the alignment beam can be adjusted to ensure that the total optical path length of the alignment beam remains unchanged irrespective of the quantity of liquid between the alignment lens system and the substrate table.

76. An apparatus according to claim 75, further comprising a controller configured to control which one or more of the plurality of optical elements is placed in the alignment beam dependent on the quantity of liquid between the alignment lens system and the substrate table.

77. An apparatus according to claim 75, further comprising a liquid supply system configured to at least partly fill a space between the alignment lens system and the substrate table, with a liquid.

78. A lithographic projection apparatus comprising a support structure configured to hold a patterning device that serves to pattern a beam of radiation according to a desired pattern, a projection system configured to project the patterned beam onto a target portion of the substrate, and an alignment apparatus according to claim 75.

79. An apparatus according to claim 78, wherein the alignment beam traverses at least part of the projection system.

80. An alignment apparatus comprising:
a substrate table configured to hold a substrate, the substrate having a substrate mark;
an alignment lens system configured to detect alignment between a reference mark and the substrate mark using an alignment beam of radiation; and
a plurality of optical elements, removably positionable in the path of the alignment beam, configured to adjust the focal plane of the alignment lens system when detecting alignment, wherein the optical elements are removably positionable in a position prior to a final element in the alignment lens system,
wherein the presence, or position, or both the presence and position, of one or more of the plurality of optical elements in the path of the alignment beam is adjusted such that with the liquid between the alignment lens system and the point of focus of the alignment lens system, the point of focus of the alignment lens system remains unchanged from without a liquid between the alignment lens system and the point of focus of the alignment lens system.

81. An apparatus according to claim 80, further comprising a controller configured to control which one or more of the plurality of optical elements is placed in the alignment beam dependent on the quantity of liquid between the alignment lens system and the substrate table.

82. An apparatus according to claim 80, further comprising a liquid supply system configured to at least partly fill a space between the alignment lens system and the substrate table, with a liquid.

83. An apparatus according to claim 82, wherein the alignment beam traverses at least part of the projection system.

84. A lithographic projection apparatus comprising a support structure configured to hold a patterning device that serves to pattern a beam of radiation according to a desired pattern, a projection system configured to project the patterned beam onto a target portion of the substrate, and an alignment apparatus according to claim 80.

* * * * *

UNITED STATES PATENT AND TRADEMARK OFFICE
CERTIFICATE OF CORRECTION

PATENT NO. : 7,589,818 B2 Page 1 of 1
APPLICATION NO. : 10/743266
DATED : September 15, 2009
INVENTOR(S) : Johannes Catharinus Hubertus Mulkens et al.

It is certified that error appears in the above-identified patent and that said Letters Patent is hereby corrected as shown below:

On title page, item (56) References Cited
replace "2002/0097488 A1*"
with --2002/0097486 A1*--.

Signed and Sealed this

Third Day of November, 2009

David J. Kappos
*Director of the United States Patent and Trademark Office*